(12) United States Patent
Chen et al.

(10) Patent No.: US 9,800,230 B1
(45) Date of Patent: Oct. 24, 2017

(54) LATCH-BASED POWER-ON CHECKER

(71) Applicant: QUALCOMM Incorporated, San Diego, CA (US)

(72) Inventors: Wilson Chen, San Diego, CA (US); Chiew-Guan Tan, San Diego, CA (US); Reza Jalilizeinali, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/197,589

(22) Filed: Jun. 29, 2016

(51) Int. Cl.
| | |
|---|---|
| *H03K 5/00* | (2006.01) |
| *H03K 3/012* | (2006.01) |
| *H03K 17/22* | (2006.01) |
| *H03K 3/037* | (2006.01) |
| *H03K 5/19* | (2006.01) |

(52) U.S. Cl.
CPC ........... *H03K 3/012* (2013.01); *H03K 3/0375* (2013.01); *H03K 5/19* (2013.01); *H03K 17/223* (2013.01)

(58) Field of Classification Search
None
See application file for complete search history.

(56) References Cited

U.S. PATENT DOCUMENTS

| 5,874,853 | A | 2/1999 | Yamaguchi et al. |
| 7,233,468 | B2 | 6/2007 | Chang et al. |
| 7,551,497 | B2 * | 6/2009 | Yuan .................. G11C 7/02 365/189.11 |
| 8,138,807 | B2 * | 3/2012 | Wada .................. G06F 1/24 327/143 |
| 8,680,710 | B2 | 3/2014 | Nogawa |
| 8,726,088 | B2 | 5/2014 | Chen |
| 9,000,799 | B1 | 4/2015 | Rajagopal et al. |
| 2002/0011883 | A1 | 1/2002 | Yamazaki et al. |
| 2014/0035634 | A1 | 2/2014 | Shrivastava et al. |

FOREIGN PATENT DOCUMENTS

EP     1986323 A2     10/2008

OTHER PUBLICATIONS

International Search Report and Written Opinion—PCT/US2017/029471—ISA/EPO—dated Jun. 30, 2017.

* cited by examiner

*Primary Examiner* — Long Nguyen
(74) *Attorney, Agent, or Firm* — Haynes and Boone, LLP

(57) ABSTRACT

A latch-based power-on checker (POC) circuit for mitigating potential problems arising from an improper power-up sequence between different power domains (e.g., core and input/output (I/O)) on a system-on-chip (SoC) integrated circuit (IC). In one example, the core power domain having a first voltage (CX) should power up before the I/O power domain having a second voltage (PX), where PX>CX. If PX ramps up before CX, the POC circuit produces a signal indicating an improper power-up sequence, which causes the I/O pads to be placed in a known state. After CX subsequently ramps up, the POC circuit returns to a passive (LOW) state. If CX should subsequently collapse while PX is still up, the POC circuit remains LOW until PX also collapses.

21 Claims, 9 Drawing Sheets

| PX | CX | POC |
|---|---|---|
| 0 | 0 | 0 |
| 0 | 1 | 0 |
| 1 | 0 | 1 |
| 1 | 1 | 0 |
| 1 | 0' | 0 |

602 — row 1
604 — row 2
606 — row 3
608 — row 4
610 — row 5

FIG. 6

LATCH-BASED POWER-ON CHECKER

TECHNICAL FIELD

The invention relates to power distribution in integrated circuits (ICs), and more particularly to power-on checkers for system-on-chip (SoC) ICs with multiple power domains.

BACKGROUND

System-on-chip (SoC) integrated circuits (ICs) integrate multiple components of an electronic system into one chip, e.g., processor core(s), memory blocks, external input/output (I/O) interfaces, and power management circuits. SoCs usually include at least two different power domains operating in different frequency and voltage ranges for different components, e.g., processor core(s) (CX domain), which may utilize voltages below 1V, and external I/O pads (PX domain), which may utilize higher voltages, e.g., ~2V.

When an SoC is initially powered up, the order in which power is applied to the different power domains may be selected to reduce power consumption in the SoC and to ensure correct functionality. If power is supplied to the power domains in an incorrect order (e.g. PX comes up before CX), severe leakage or even false communication on a channel could occur, which could potentially cause the entire system to crash.

To avoid such consequences, power-on checkers (POC) (also referred to as power-on sequencers) are used to monitor the power up sequence of the different power domains and keep the I/O circuits in expected states, e.g., tristate, in the case of an incorrect power up sequence. As used herein, "tristate" refers to a condition in which the I/O driver is not driving the pad to which it is connected HIGH and is not pulling the pad LOW, but rather placing it in a high impedance state, indicating to the corresponding pad on another IC that the state of the pad is unknown or unreliable.

Logically, the functionality of a POC circuit can be realized with a single AND gate 100 with inputs for PX 104 and the complement of CX 106, and POC output 108, as shown in FIG. 1A.

FIG. 1B is a table 102 showing the logical input/output outcomes for the AND gate 100. In the ideal scenario, POC output 108 is HIGH when PX 104 is HIGH and CX is LOW, indicating an incorrect power-up sequence. However, as described above, in practice CX typically has a significantly lower voltage than PX. As such, the CX input may not be able to completely turn off a pull-up PFET (not shown) of circuitry implementing the logical AND gate 100, which may lead to a constant leakage path from PX to ground.

To reduce the leakage, native NFETs, which have a very small threshold voltage, have been used in the AND gate implementation instead of PFETs. However, as industry is moving from planar CMOS manufacturing processes to smaller FinFET (Fin Field Effect Transistor) processes, native NFETs may not be available due to process manufacture limits.

Another drawback of the AND implementation is its lack of support for CX collapse after both PX and CX have powered up. CX collapse may occur when the core(s) in the CX domain are idle or are placed in a power-save mode, which is a feature used by many mobile applications to reduce power consumption. In such cases, it is not desirable for the AND gate to output a signal indicating an incorrect power-up sequence after CX drops to LOW (i.e., state 154 in FIG. 1B where PX=1, CX=0, and POC=1), as CX may come up and collapse multiple times during normal operation of the SoC. Also, since the AND gate is powered by PX, all devices must be thick I/O devices due to the higher voltages. The voltage of CX may be further lowered and eventually flip the POC output causing unintentional I/O state lock up in the system.

BRIEF DESCRIPTION OF THE DRAWINGS

FIG. 6 is a table showing the logical input/output response of the latch-based POC circuit of FIG. 2.

SUMMARY

A power-on checker (POC) circuit is disclosed for an integrated circuit (IC) that includes multiple power domains. The POC circuit includes a latch circuit with first and second nodes. A first trigger circuit is coupled to the first node and a first voltage supply associated with a first power domain) (e.g. a voltage supply PX associated with an input/output (I/O) power domain). A second trigger circuit is coupled to the second node and a second voltage supply associated with the second power domain (e.g. a voltage supply CX associated with a processor core power domain.

The first and second trigger circuits are configured to output a signal indicating an incorrect power-up sequence if the second voltage supply ramps up before the first voltage supply, and to output a signal indicating a correct power-up sequence if the first voltage supply ramps up subsequent to a ramp-up of the second voltage supply. The POC circuit may maintain the output of the signal indicating a correct power-up sequence if the first voltage supply subsequently collapses. However, the POC circuit will reset, i.e., output a signal indicating an incorrect power up sequence, if the second power supply collapses while the first power supply is collapsed and the second power supply subsequently ramps up while the first power supply is collapsed.

DETAILED DESCRIPTION

Figure 2:
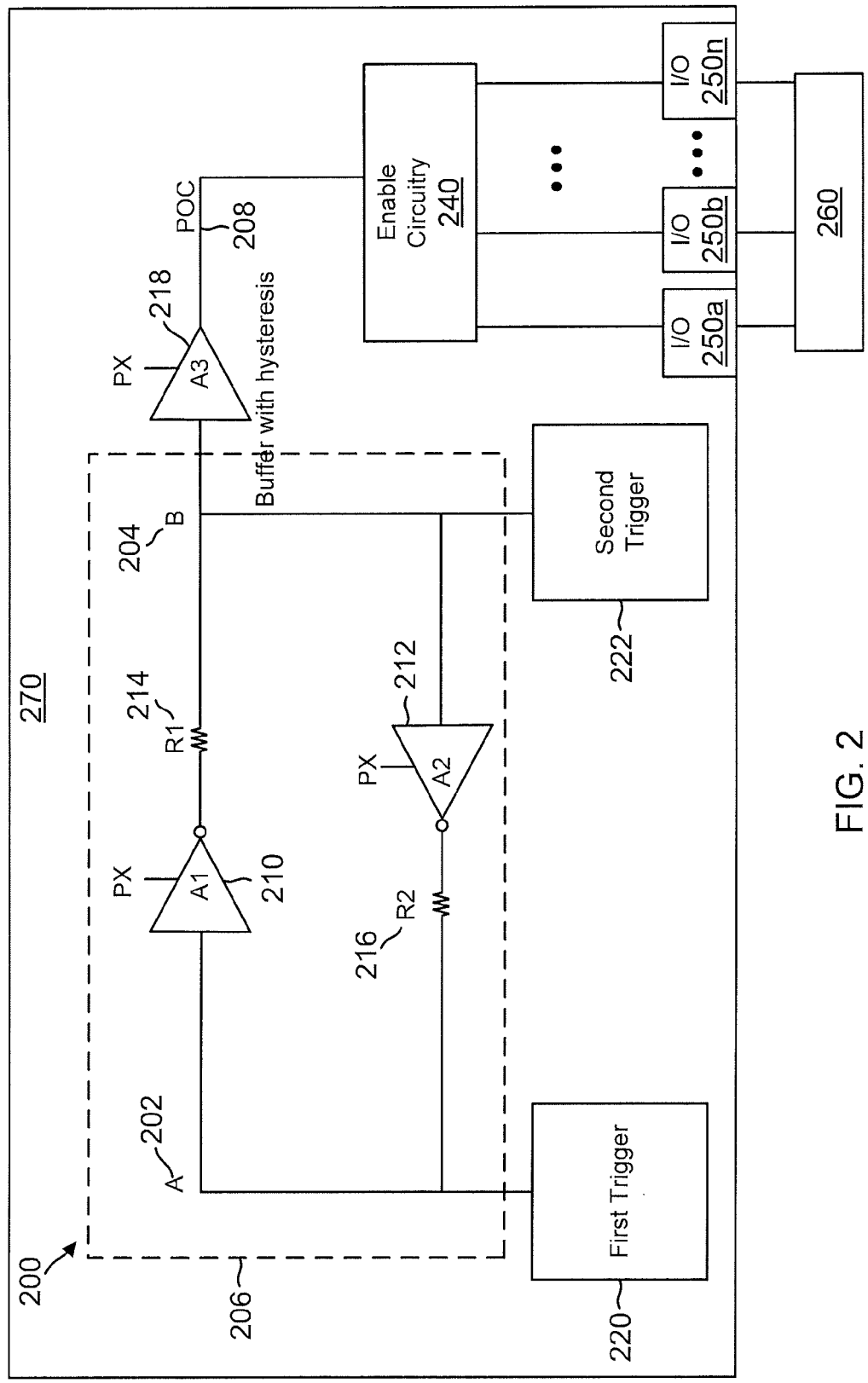
FIG. 2 is a schematic diagram of a latch-based POC circuit.

FIG. 2 shows an exemplary latch-based power-on checker (POC) circuit 200. The POC circuit 200 includes a latch 206 including two nodes, Node A 202 and Node B 204, and cross-coupled inverters (A1) 210 and (A2) 212, where Node B is also coupled to the POC output 208. Unlike the AND gate implementation described above, latch-based POC circuit 200 does not require native NFETs and is suitable for FinFET manufacturing processes.

Cross coupled inverters 210 and 212 form a latch and resistors (R1) 214 and (R2) 216 are connected to the output of each inverter to minimize the impact of process skew between PFETs and NFETs in the inverters. A buffer (A3) 218 may be provided as a buffer with hysteresis to clean up any noise at the output due to the slow ramp up of the PX supply.

Node A 202 is controlled by a first trigger circuit 220, and Node B 204 is controlled by a second trigger circuit 222.

POC 200 is included in a first IC die 270. The POC output 208 controls enable circuitry 240, which controls the state of I/O pads 250a through 250n, which are connected to corresponding I/O pads on one or more IC dies 260. During normal operation, when POC output 208 is LOW, I/O pads 250a through 250n may output a "0" or "1". However, when POC output 208 is HIGH, indicating an improper power up sequence, the I/O pads of IC die 270 are placed in a tristate condition—a high impedance state which indicates the output of the I/O pads are unknown or unreliable.

Figure 3:
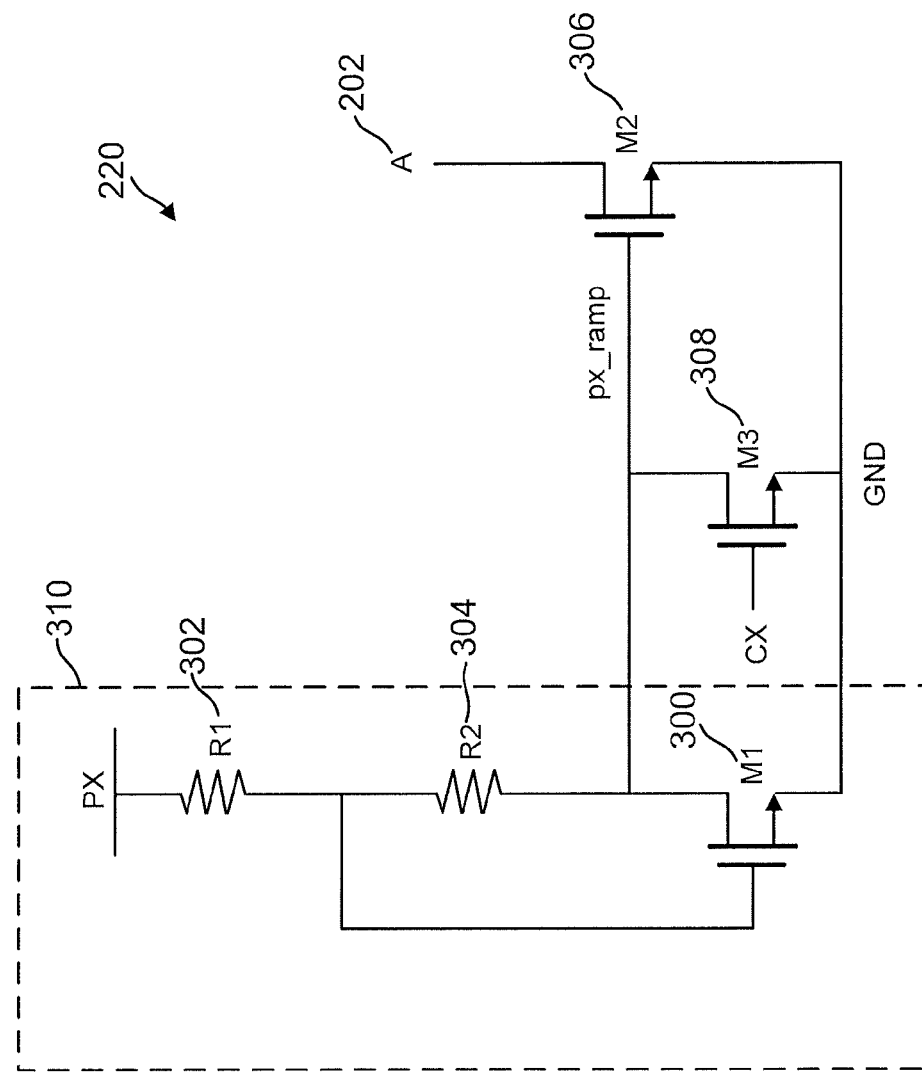
FIG. 3 is a circuit diagram of a first trigger circuit for the latch-based POC circuit of FIG. 2.

As shown in FIG. 3, the first trigger circuit 220 includes a first transistor (M1) 300 including a drain coupled to PX through one or more resistors (R1) 302, (R2) 304, a gate coupled to PX through resistor (R1) 302, and a source coupled to ground. A second transistor (M2) 306 includes a drain coupled to Node A 202, a gate coupled to the drain of the first transistor 300, and a source coupled to ground. When PX ramps up, a gate voltage px_ramp of the second transistor 306 tracks PX, turning on the second transistor 306 and pulling Node A LOW until PX is sufficient to turn the first transistor 300 on, thereby pulling px_ramp to ground and turning off the second transistor 306, which isolates Node A. The first trigger circuit 220 may also include a third transistor (M3) 308 controlled by CX and coupled between the gate of the second transistor 306 and ground. The third transistor 308 turns on as CX goes HIGH, further grounding pxramp to avoid any leakage through the gate of the second transistor 306.

Figure 4:
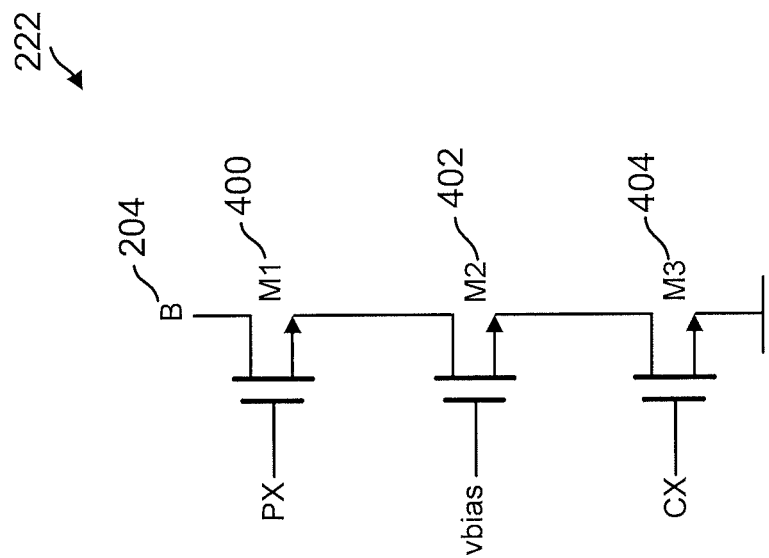
FIG. 4 is a circuit diagram for a second trigger circuit for the latch-based POC circuit of FIG. 2.

The second trigger circuit 222 is a pulldown circuit controlled by CX such that when CX is up, the second trigger circuit 222 will constantly pull Node B 204 down and force the POC output 208 to LOW. FIG. 4 shows an exemplary second trigger circuit 222 circuit in which Node B is coupled to one or more transistors (M1) 400, (M2) 402 controlled by PX, which are coupled to ground by another transistor (M3) 404 controlled by CX. Transistor 402 is controlled by Vbias, which is a bias voltage generated off of the PX supply.

Since PX is usually an I/O voltage (e.g., ~2V) and CX is a core voltage (e.g., <1V), transistors 400, 402 may be thick oxide I/O devices that protect transistor 404, which is a core device, from seeing over-voltage at its terminals.

Figure 5:
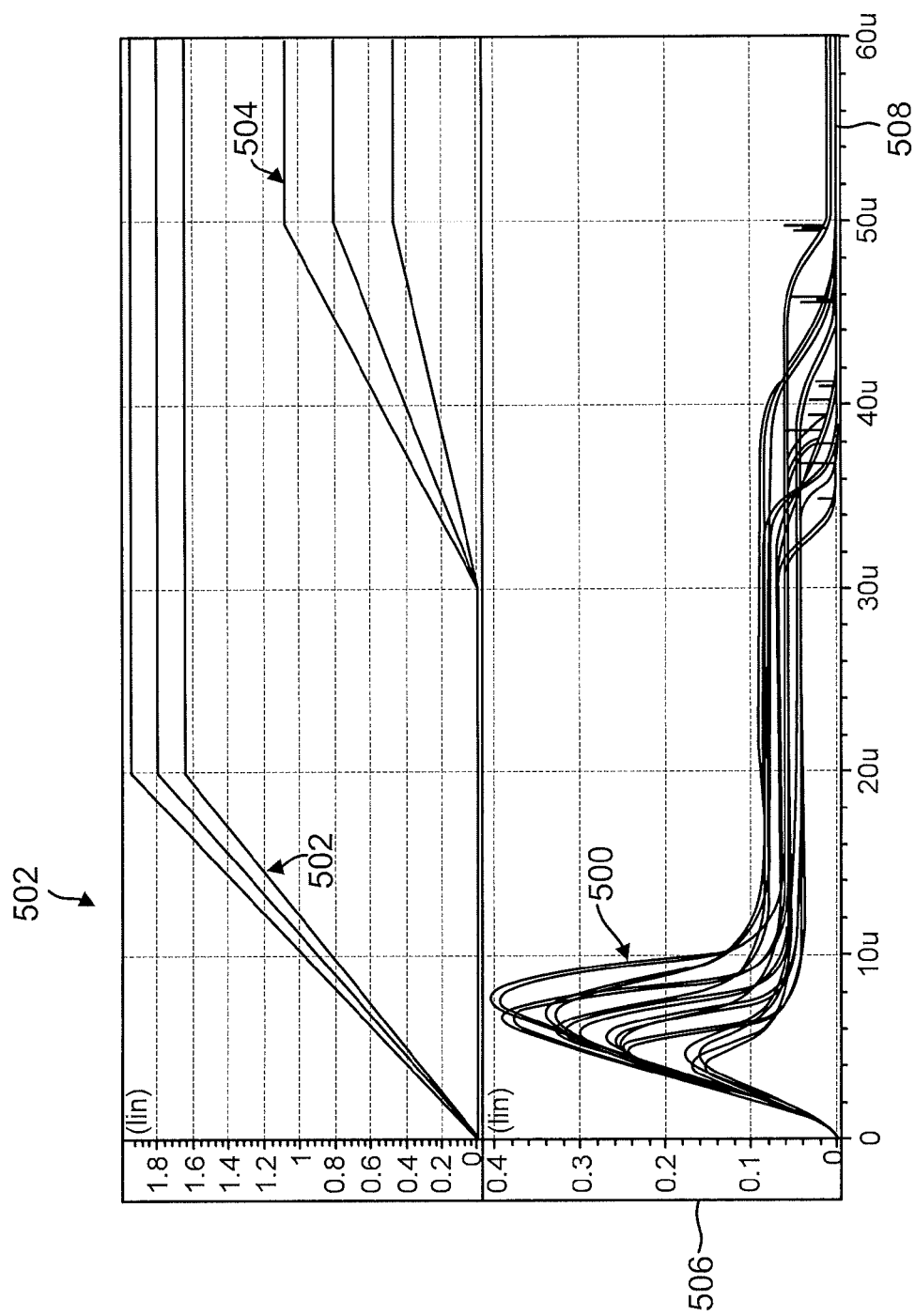
FIG. 5 is a plot showing a signal response for the circuit of FIG. 3 for an incorrect power-on sequence.

As described above, the first trigger circuit 220 is based on a pulse signal px_ramp that is only activated during the initial phase of the PX ramp up, i.e., when PX initially rises. FIG. 5 shows how the px_ramp signal 500 behaves with respect to PX 502 and CX 504. Reference is also made to FIGS. 2 and 3 to describe the signal behavior shown in FIG. 5 with respect to the POC circuit components.

Resistors (R1) 302, (R2) 304 and transistor (M1) 300 form a startup circuit 310 (FIG. 3). When PX 502 ramps up from 0V, the signal px_ramp 500 will track the PX voltage until PX is high enough to turn on transistor 300 and thus increase the pull down current through transistor (M3) 306. Since the cross-coupled latch 206 in the POC circuit 200 is also powered by PX, an increase of current through the first trigger circuit 220 will force the POC output 208 to HIGH with CX still being LOW (i.e., second trigger circuit 222 off). When CX starts to ramp up at the gate of transistor (M3) 404, the second trigger circuit 222 will then pull the POC output 208 LOW and transistor (M3) 308 in the first trigger circuit 220 will be turned on to further ensure px_ramp 500 is grounded (at 508) to avoid any leakage through transistor (M3) 306 as Node A 202 will be driven HIGH by the latch 206.

In the case where CX is already up when PX is powered up, transistor (M3) 308 is already turned on to pull px_ramp down strongly, thereby preventing any pulse from being generated by the startup circuit 310.

It may be preferable to choose relatively large resistors 302, 304 and select a transistor 300 with a relatively small width and large length to prevent a leakage path from PX to ground through resistors 302, 304 and transistors 300, 308. Using such a design, the leakage through this path can be constrained to a sub-µA target.

Figure 1:
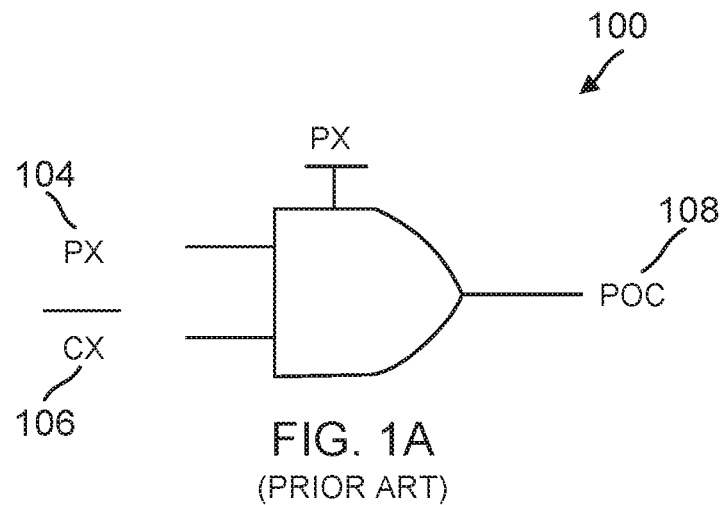
FIG. 1A shows an AND circuit-based power-on checker (POC) circuit.
FIG. 1B is a table showing the logical input/output response of the AND circuit-based POC circuit of FIG. 1A.

The POC circuit 200 does not act as a simple AND gate 100 such as that shown in FIG. 1A in that latch-based POC circuit 200 makes an allowance for CX collapse. FIG. 6 is a table 600 showing the logical input/output outcomes of the POC circuit 200 for comparison to the table of FIG. 1B for AND gate 100. Below is an operational summary of the proposed POC circuit in different logical conditions.

When both CX and PX are down (PX=0, CX=0) 602, the POC output 208 will be LOW (POC=0) because buffer (A3) 218 is also powered by PX.

When CX is up and PX is down (PX=0, CX=1) 604, again the POC output 208 will be LOW (POC=0) because buffer (A3) 218 is also powered by PX.

When CX is down and PX is up (PX=1, CX=0) 606, e.g., due to an improper power-up sequence, the first trigger circuit 220 initially pulls Node A to LOW, and subsequently isolates that node. The latch pulls Node B to HIGH, pulling the POC output HIGH (POC=1), indicating an improper sequence power-up and a need to mitigate the improper power up sequence, e.g., by placing elements in the I/O power domain in a known state (e.g., a tristate).

When CX subsequently ramps up to HIGH (PX=1, CX=1) 608, the second trigger circuit 222 pulls Node B to LOW, deactivating the POC (POC=0), and the latch pulls A to HIGH. The same condition would apply if the proper power-up sequence occurred, where CX ramped up prior to PX.

When PX ramps up before CX (PX=1, CX=0), the POC output is HIGH (PX=1) 606, which causes the SoC to place the I/O pads in a known state (e.g., tristate), which is identical to state 154 in FIG. 1B. However, if CX subsequently collapses, i.e, drops to LOW (CX=0'), due to power collapse or a power-save mode in the core while PX is still HIGH (PX=1), the second trigger circuit 222, which includes a transistor 404 controlled by CX, isolates Node B, which is LOW, maintaining the POC output in a deactivated state (i.e., PX=1, CX=0', POC=0) 610. The logical input/output response of the POC circuit shown in FIG. 6 will not reset until PX subsequently drops to LOW (PX=0).

Figure 7:
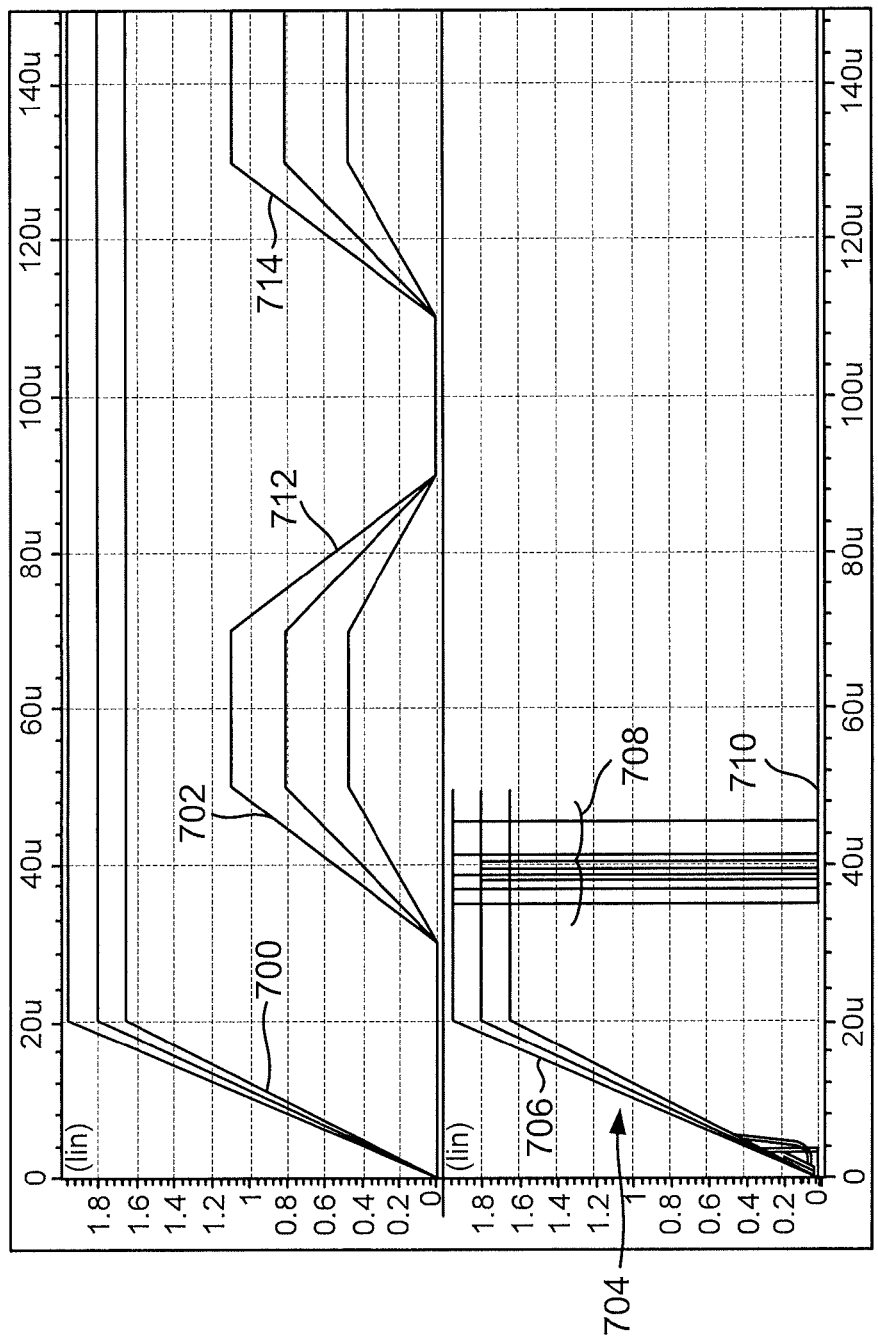
FIG. 7 is a plot showing a signal response for the circuit of FIG. 3 including a CX power collapse after an incorrect power-on sequence.

FIG. 7 shows an example of a power-up sequence in which PX 700 ramps up before CX 702. The px_ramp signal 704 ramps up in the region 706 until CX ramps up at region 708, at which point px_ramp drops to ground in region 710. CX subsequently collapses in region 712 and then ramps up again in region 714 without px_ramp subsequently ramping up in response, thereby supporting CX collapse, unlike the traditional AND-gate implementation of FIG. 1A when CX drops subsequent to a proper power-up sequence (PX=1, CX=0, POC=1) 154 of FIG. 1B).

Figure 8:
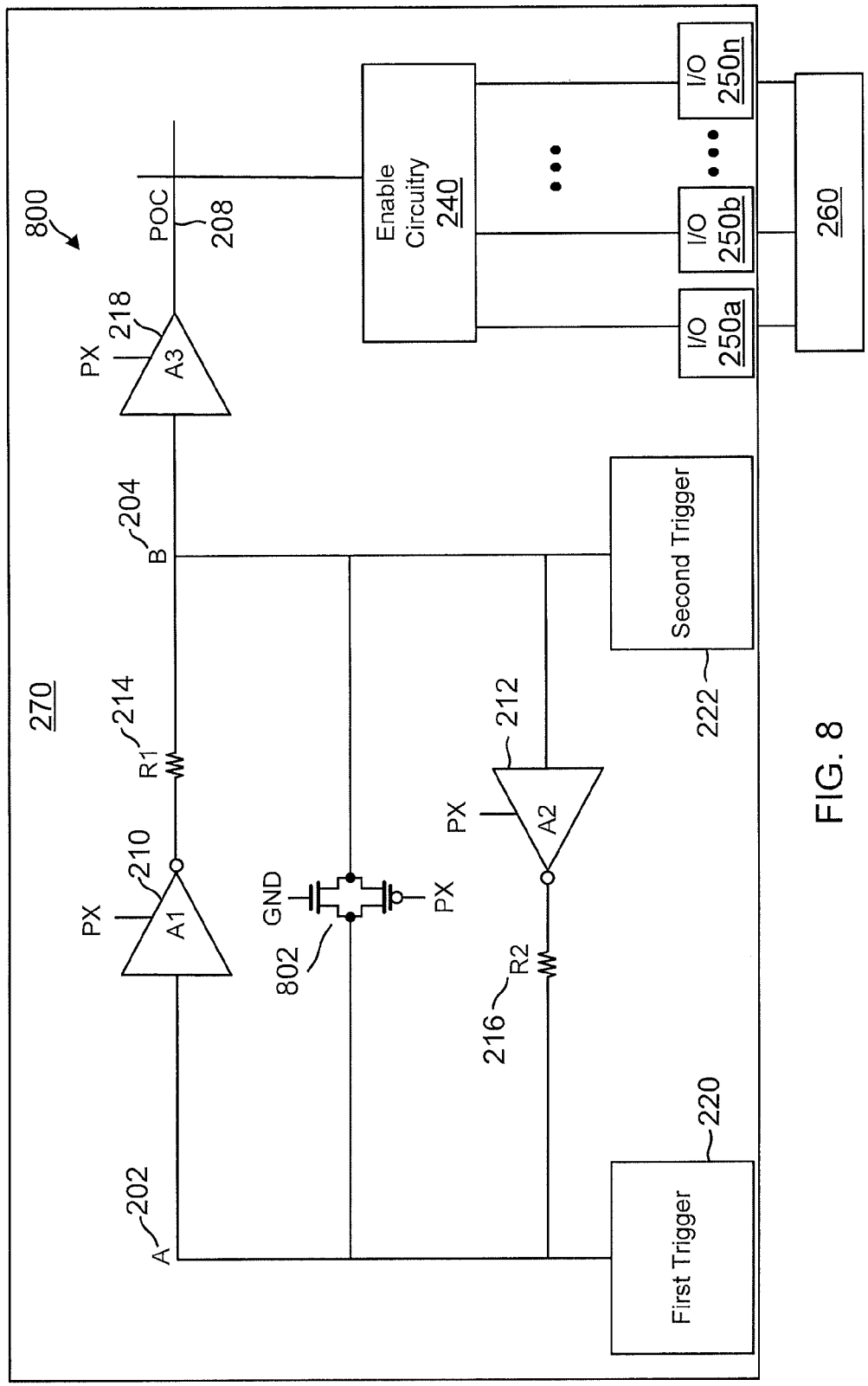
FIG. 8 is a schematic diagram of another latch-based POC circuit.

Due to the nature of the cross-coupled latch 206, when PX starts ramping up while CX is still down, the outcome will be sensitive to the initial condition on Nodes A and B. FIG. 8 illustrates an exemplary POC circuit 800 to mitigate this potential problem during the initial power up of PX. A passgate 802 is introduced between Nodes A and B to average the charge between the nodes and to reduce their initial offset voltage.

Figure 9:
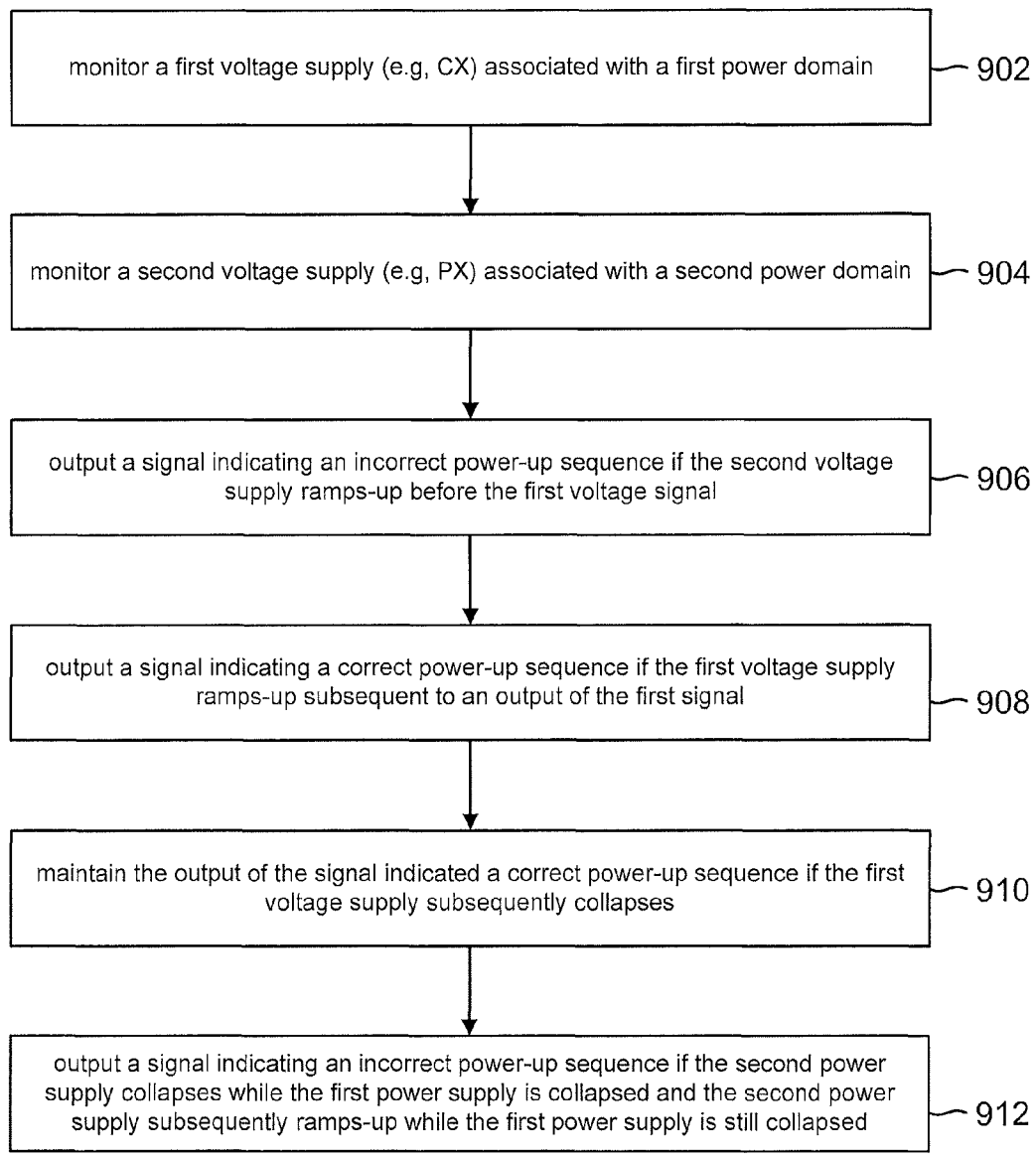
FIG. 9 is a flowchart showing acts in a method according to an embodiment.

FIG. 9 shows a method 900 according to an embodiment of the POC circuit of FIG. 2. The POC circuit monitors a first voltage supply (e.g., CX) associated with the first power domain (act 902), and monitors a second voltage supply (e.g., PX) associated with the second power domain (act 904). The POC circuit outputs a signal indicating an incorrect power-up sequence if the second voltage supply ramps up before the first voltage supply (act 906). If the first voltage supply ramps up subsequent to an output of a signal indicating an incorrect power-up sequence, the POC circuit outputs a signal indicating a correct power-up sequence (act 908), and maintains the output of this signal if the first voltage supply subsequently collapses (act 910). The POC circuit outputs a signal indicating an incorrect power-up sequence if the second power supply collapses while the first power supply is collapsed and the second power supply subsequently ramps up while the first power supply is still collapsed (act 912).

As those of skill in the art will appreciate, and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely examples, but rather, should be commensurate with the scope of the claims and their functional equivalents.

We claim:

1. A power-on checker (POC) for an integrated circuit (IC) comprising first and second power domains, the POC comprising:
    a latch circuit including first and second nodes;
    a first trigger circuit coupled to the first node and coupled to a first voltage supply associated with the first power domain;
    a second trigger circuit coupled to the second node and coupled to a second voltage supply associated with the second power domain;
    wherein the POC is configured to
        output a first signal indicating an incorrect power-up sequence if the second voltage supply ramps up before the first voltage supply,
        output a second signal indicating a correct power-up sequence if the first voltage supply ramps up subsequent to an output of the first signal, and
        maintain the output of the second signal if the first voltage supply subsequently collapses.

2. The POC of claim 1, wherein the second trigger circuit comprises a pulldown circuit controlled in part by the second power supply.

3. The POC of claim 1, wherein the first trigger circuit comprises a circuit including a first transistor coupled to the first node,
    wherein the first transistor comprises a gate controlled by a pulse signal associated with a rising of the second voltage supply.

4. The POC of claim 3, wherein the first trigger circuit further includes a second transistor coupled between the gate of the first transistor and ground, the second transistor including a gate controlled by the first voltage supply, and
    wherein the second transistor is configured to pull the gate of the first transistor to ground when the first voltage supply ramps up, thereby turning the first transistor off and isolating a signal on the first node.

5. The POC of claim 1, wherein the POC comprises FinFET transistors.

6. The POC of claim 1, wherein the first voltage supply is associated with a core power domain.

7. The POC of claim 1, wherein the second voltage supply is associated with an input/output (I/O) power domain.

8. The POC of claim 1, further comprising:
    an enable circuit configured to disable a plurality of I/O pads associated with the IC in response to the first signal.

9. The POC of claim 1, wherein the POC is further configured to output the first signal if the second power supply collapses while the first power supply is collapsed and the second power supply subsequently ramps up while the first power supply is collapsed.

10. A method for monitoring a correct power-on sequence for an integrated circuit (IC) comprising first and second power domains, the method comprising,
    monitoring a first voltage supply associated with the first power domain;
    monitoring a second voltage supply associated with the second power domain;
    outputting a first signal indicating an incorrect power-up sequence if the second voltage supply rises before the first voltage supply,
    outputting a second signal indicating a correct power-up sequence if the first voltage supply ramps up subsequent to an output of the first signal, and
    maintaining the output of the second signal if the first voltage supply subsequently collapses.

11. The method of claim 10, wherein the first voltage supply is associated with a processor core power domain.

12. The method of claim 10, wherein the second voltage supply is associated with an input/output (I/O) power domain.

13. The method of claim 10, further comprising:
    outputting the first signal if the second power supply collapses while the first power supply is collapsed and the second power supply subsequently ramps up while the first power supply is collapsed.

14. A power-on checker (POC) for an integrated circuit (IC) comprising first and second power domains, the POC comprising:
    a latch circuit including a first node and a second node, the second node coupled to an output of the POC;
    a first trigger circuit coupled to the first node and a first voltage supply associated with the first power domain;
    a second trigger circuit coupled to the second node and a second voltage supply associated with the second power domain;
    means for outputting a first signal indicating an incorrect power-up sequence if the second voltage supply ramps up before the first voltage supply;
    means for outputting a second signal indicating a correct power-up sequence if the first voltage supply ramps up subsequent to an output of the first signal, and
    means for maintaining the output of the second signal if the first voltage supply subsequently collapses.

15. The POC of claim 14, wherein the second trigger circuit comprises a pulldown circuit controlled in part by the second power supply.

16. The POC of claim 15, wherein the first trigger circuit comprises a circuit including a first transistor coupled to the first node,
   wherein the first transistor comprises a gate controlled by a pulse signal associated with a rising of the second voltage supply.

17. The POC of claim 16, wherein the first trigger circuit further comprises:
   means for pulling the gate of the first transistor to ground when the first voltage supply ramps up, thereby turning the first transistor off and isolating a signal on the first node.

18. The POC of claim 14, wherein the POC comprises FinFET transistors.

19. The POC of claim 14, wherein the first voltage supply is associated with a processor core power domain.

20. The POC of claim 14, wherein the second voltage supply is associated with an input/output (I/O) power domain.

21. The POC of claim 14, further comprising:
   means for disabling a plurality of I/O pads associated with the IC in response to the first signal.

\* \* \* \* \*